United States Patent
Chang Chien et al.

(10) Patent No.: US 11,569,210 B2
(45) Date of Patent: Jan. 31, 2023

(54) PACKAGE STRUCTURE HAVING A FIRST CONNECTION CIRCUIT AND MANUFACTURING METHOD THEREOF

(71) Applicant: Powertech Technology Inc., Hsinchu County (TW)

(72) Inventors: Shang-Yu Chang Chien, Hsinchu County (TW); Nan-Chun Lin, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/342,559

(22) Filed: Jun. 9, 2021

(65) Prior Publication Data

US 2022/0320052 A1 Oct. 6, 2022

(30) Foreign Application Priority Data

Mar. 31, 2021 (TW) .................................. 110111833

(51) Int. Cl.
*H01L 23/498* (2006.01)
*H01L 25/10* (2006.01)
(Continued)

(52) U.S. Cl.
CPC .......... *H01L 25/105* (2013.01); *H01L 21/561* (2013.01); *H01L 21/565* (2013.01);
(Continued)

(58) Field of Classification Search
CPC . H01L 21/561; H01L 21/565; H01L 23/3128; H01L 23/49816;
(Continued)

(56) References Cited

U.S. PATENT DOCUMENTS

| 2014/0248742 A1* | 9/2014 | Gonzalez ................ H01L 25/50 438/107 |
| 2017/0033080 A1 | 2/2017 | Chen et al. |

(Continued)

FOREIGN PATENT DOCUMENTS

| TW | 201246499 | 11/2012 |
| TW | 201813016 | 4/2018 |

(Continued)

OTHER PUBLICATIONS

"Office Action of Taiwan Counterpart Application", dated Sep. 29, 2021, p. 1-p. 5.

*Primary Examiner* — Khiem D Nguyen
(74) *Attorney, Agent, or Firm* — JCIPRNET

(57) ABSTRACT

A package structure, including a redistribution circuit layer, a first die, a dielectric body, a first connection circuit, a patterned insulating layer, a second die and a third die, is provided. The first die is disposed on the redistribution circuit layer and is electrically connected to the redistribution circuit layer. The dielectric body is disposed on the redistribution circuit layer and covers the first die. The first connection circuit is disposed on the dielectric body and is electrically connected to the redistribution circuit layer. The patterned insulating layer covers the first connection circuit. A portion of the patterned insulating layer is embedded in the dielectric body. The second die is disposed on the dielectric body and is electrically connected to the first connection circuit. The third die is disposed on the redistribution circuit layer, is opposite to the first die, and is electrically connected to the redistribution circuit layer.

19 Claims, 9 Drawing Sheets

(51) Int. Cl.
    *H01L 23/31*     (2006.01)
    *H01L 23/00*     (2006.01)
    *H01L 21/56*     (2006.01)
    *H01L 25/00*     (2006.01)
    *H01L 23/538*     (2006.01)

(52) U.S. Cl.
    CPC .... *H01L 23/3128* (2013.01); *H01L 23/49816* (2013.01); *H01L 23/5383* (2013.01); *H01L 24/16* (2013.01); *H01L 24/17* (2013.01); *H01L 24/32* (2013.01); *H01L 24/33* (2013.01); *H01L 24/73* (2013.01); *H01L 24/81* (2013.01); *H01L 24/83* (2013.01); *H01L 24/96* (2013.01); *H01L 24/97* (2013.01); *H01L 25/50* (2013.01); *H01L 2224/16227* (2013.01); *H01L 2224/17181* (2013.01); *H01L 2224/32225* (2013.01); *H01L 2224/33181* (2013.01); *H01L 2224/73204* (2013.01); *H01L 2224/73253* (2013.01); *H01L 2224/83102* (2013.01); *H01L 2924/37001* (2013.01)

(58) Field of Classification Search
    CPC . H01L 2224/17181; H01L 2224/33181; H01L 24/16; H01L 24/17; H01L 24/32; H01L 24/33; H01L 24/73; H01L 24/81; H01L 24/83; H01L 24/96; H01L 24/97
    USPC ........................................................ 257/773
    See application file for complete search history.

(56) References Cited

U.S. PATENT DOCUMENTS

| | | | |
|---|---|---|---|
| 2018/0068978 A1* | 3/2018 | Jeng | H01L 25/50 |
| 2018/0294237 A1 | 10/2018 | Hung et al. | |
| 2019/0096866 A1* | 3/2019 | Hsu | H01L 24/32 |
| 2019/0237385 A1* | 8/2019 | Chen | H01L 21/561 |
| 2020/0219847 A1* | 7/2020 | Yang | H01L 21/561 |
| 2020/0258849 A1 | 8/2020 | Hung et al. | |
| 2020/0328161 A1* | 10/2020 | Lin | H01L 24/20 |
| 2021/0074645 A1* | 3/2021 | Tsai | H01L 25/50 |

FOREIGN PATENT DOCUMENTS

| | | |
|---|---|---|
| TW | 202034474 | 9/2020 |
| TW | 202125746 | 7/2021 |

\* cited by examiner

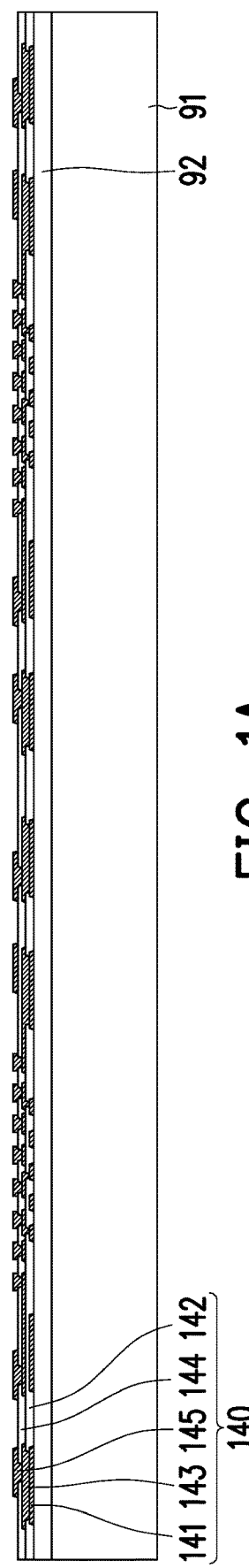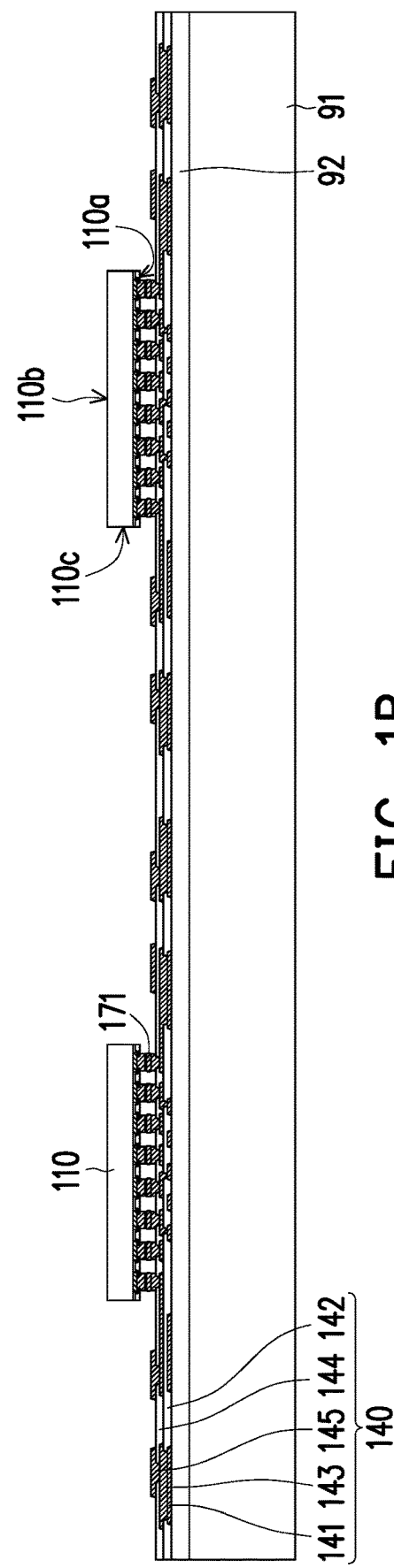

PACKAGE STRUCTURE HAVING A FIRST CONNECTION CIRCUIT AND MANUFACTURING METHOD THEREOF

CROSS-REFERENCE TO RELATED APPLICATION

This application claims the priority benefit of Taiwan application serial no. 110111833, filed on Mar. 31, 2021. The entirety of the above-mentioned patent application is hereby incorporated by reference herein and made a part of this specification.

BACKGROUND

Technical Field

This disclosure relates to a package structure and a manufacturing method thereof, and in particular to a package structure that has multiple dies and a manufacturing method thereof.

Description of Related Art

In order to enable electronic products to be light, thin and small, advancements have been made to the semiconductor packaging technology to develop products that meet requirements such as having a small size, being lightweight, having a high density, and having high competitiveness in the market.

In a die package structure that has multiple dies, how to improve the manufacturing efficiency of the package structure while still having good quality and yield has become a pressing issue.

SUMMARY

This disclosure provides a die package structure and a manufacturing method of the die package structure, which can integrate multiple dies and have good quality and yield.

The package structure of the disclosure includes a redistribution circuit layer, a first die, a dielectric body, a first connection circuit, a patterned insulating layer, a second die, and a third die. The first die is disposed on the redistribution circuit layer and is electrically connected to the redistribution circuit layer. The dielectric body is disposed on the redistribution circuit layer and covers the first die. The first connection circuit is disposed on the dielectric body and is electrically connected to the redistribution circuit layer. The patterned insulating layer covers the first connection circuit. A portion of the patterned insulating layer is embedded in the dielectric body. The second die is disposed on the dielectric body and is electrically connected to the first connection circuit. The third die is disposed on the redistribution circuit layer and is opposite to the first die. The third die is electrically connected to the redistribution circuit layer.

The manufacturing method of the package structure of the disclosure includes the following steps. A redistribution circuit layer is formed on a carrier board. A first die is disposed on the redistribution circuit layer to electrically connect to the redistribution circuit layer. A dielectric body is formed on the carrier board to cover the first die. A first connection circuit is formed on the carrier board, and a portion of the first connection circuit penetrates the dielectric body to electrically connect to the redistribution circuit layer. A patterned insulating layer is formed on the carrier board to cover the first connection circuit and embed into the dielectric body. A second die is disposed on the dielectric body and electrically connected to the first connection circuit. And, the carrier board is removed to disposed a third die on the redistribution circuit layer and is opposite to the first die, and the third die is electrically connected to the redistribution circuit layer.

Based on the above, the die package structure and the manufacturing method of the die package structure of the disclosure integrate multiple dies and have good quality and yield.

To make the abovementioned more comprehensible, several embodiments accompanied by drawings are described in detail as follows.

BRIEF DESCRIPTION OF THE DRAWINGS

FIGS. 1A to 1H are schematic partial cross-sectional views of parts of a manufacturing method of a package structure according to a first embodiment of the disclosure.

DESCRIPTION OF THE EMBODIMENTS

Figure 1C:
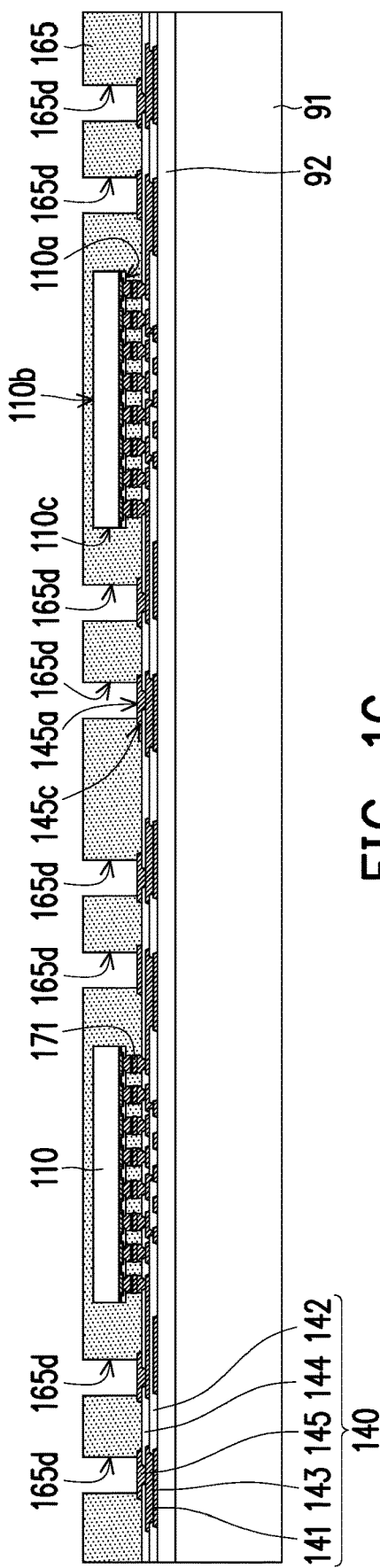

The directional terminology used in the text (for example, up, down, right, left, front, back, top, bottom) are only used with reference to the drawings and are not intended to imply absolute orientation. In addition, some of the layers or components may be omitted from the drawings for clarity.

Unless explicitly stated otherwise, any method described in the text is in no way intended to be interpreted as requiring its steps to be performed in a specific order.

The disclosure is described more comprehensively with reference to the drawings of the embodiment. However, the disclosure may also be embodied in various different forms and are not be limited to the exemplary embodiment described in the text. The thickness, dimensions, or size of the layers or regions in the drawings are exaggerated for clarity. The same or similar reference numerals indicate the same or similar elements, which will not be repeated one by one in the following paragraphs.

FIGS. 1A to 1H are schematic partial cross-sectional views of parts of a manufacturing method of a package structure according to a first embodiment of the disclosure.

With reference to FIG. 1A, a carrier board 91 is provided. The disclosure does not impose any particular limitation on the carrier board 91, as long as the carrier board 91 is suitable to carry a film layer formed on the carrier board 91 or components disposed on the carrier board 91.

In the embodiment, the carrier board 91 may have a release layer 92, but the disclosure is not limited thereto. The release layer 92 is, for example, a light to heat conversion (LTHC) adhesive layer or other similar film layers.

With reference to FIG. 1A again, in the embodiment, a redistribution circuit layer 140 may be formed on the carrier board 91. The redistribution circuit layer 140 may include conductive layers 141, 143, and 145, and insulating layers 142 and 144. The topmost insulating layer 144 (that is, an insulating layer in the redistribution circuit layer 140 that is farthest from the carrier board 91; may be referred to as a top insulating layer) may have multiple openings. The topmost conductive layer 145 (that is, a conductive layer in the redistribution circuit layer 140 that is farthest from the carrier board 91; may be referred to as a top conductive layer) may be disposed on the insulating layer 144 and embedded in the opening of the insulating layer 144.

In an embodiment, the conductive layers 141, 143, and 145 may be formed by a deposition process, a lithography process, and/or an etching process. For example, a seed layer may be formed on the carrier board 91 by a sputtering process. Then, a patterned photoresist layer may be formed on the seed layer by a lithography process. Then, a plated layer may be formed on a portion of the seed layer exposed by the patterned photoresist layer by an electroplating process. Then, the patterned photoresist layer and another portion of the seed layer that is not covered by the plated layer may be removed by an etching process. Patterned seed layers 141s, 143s, and 145s (labelled in FIG. 1J) and patterned plated layers 141p, 143p, and 145p (labelled in FIG. 1J) on them may constitute the corresponding patterned conductive layers 141, 143, and 145. That is, each of the conductive layers 141, 143, and 145 may include the seed layers 141s, 143s, and 145s and the plated layers 141p, 143p, and 145p having the same or similar patterns. For example, the conductive layer 141 may include the seed layer 141s and the plated layer 141p having the same or similar pattern, the conductive layer 143 may include the seed layer 143s and the plated layer 143p having the same or similar pattern, and the conductive layer 145 may include the seed layer 145s and the plated layer 145p having the same or similar pattern.

It should be noted that the disclosure does not limit the number of conductive layers and/or insulating layers in the redistribution circuit layer 140.

With reference to FIGS. 1A and 1B, a first die 110 is disposed on the redistribution circuit layer 140. The first die 110 may be electrically connected to a corresponding circuit in the redistribution circuit layer 140.

Figure 1D:
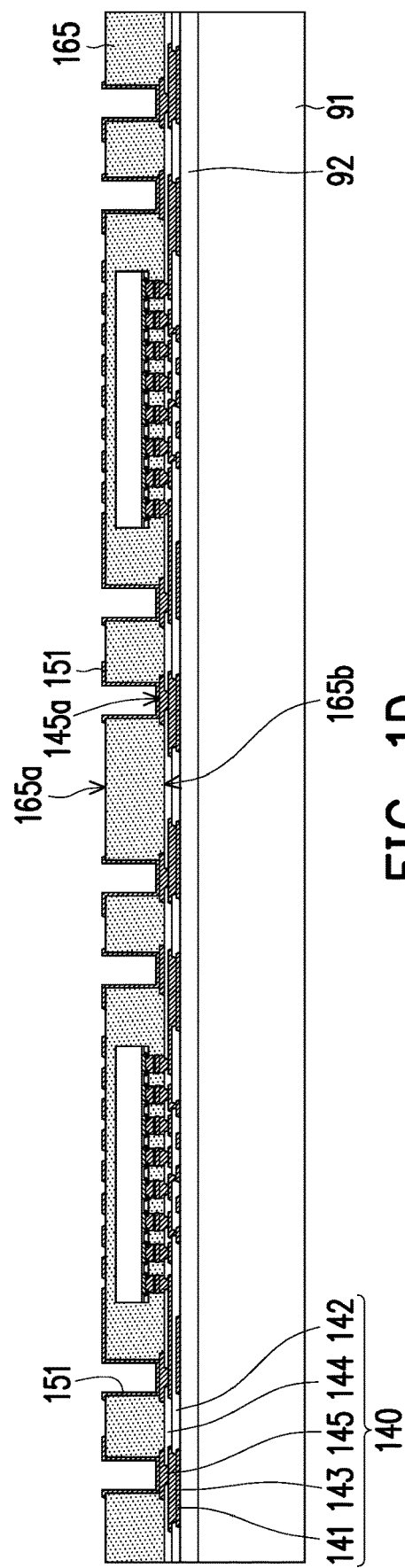
Figure 1E:
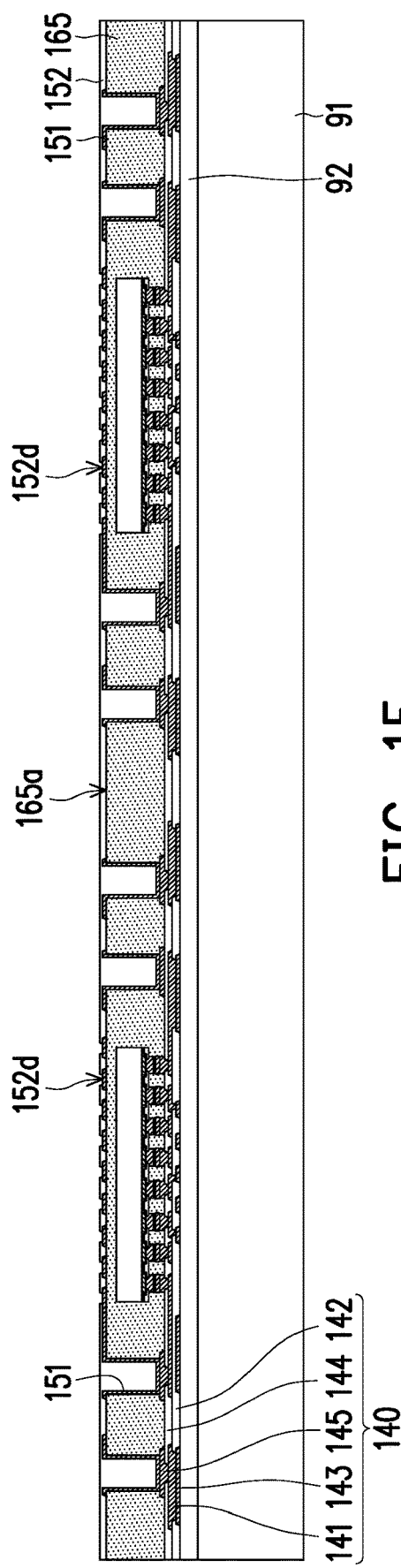
Figure 1F:
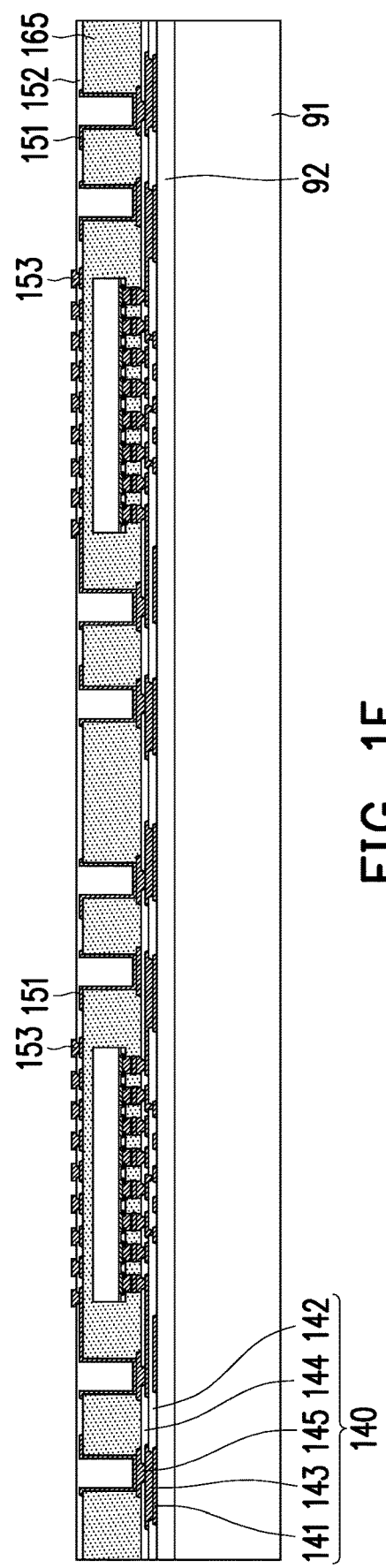
Figure 1G:
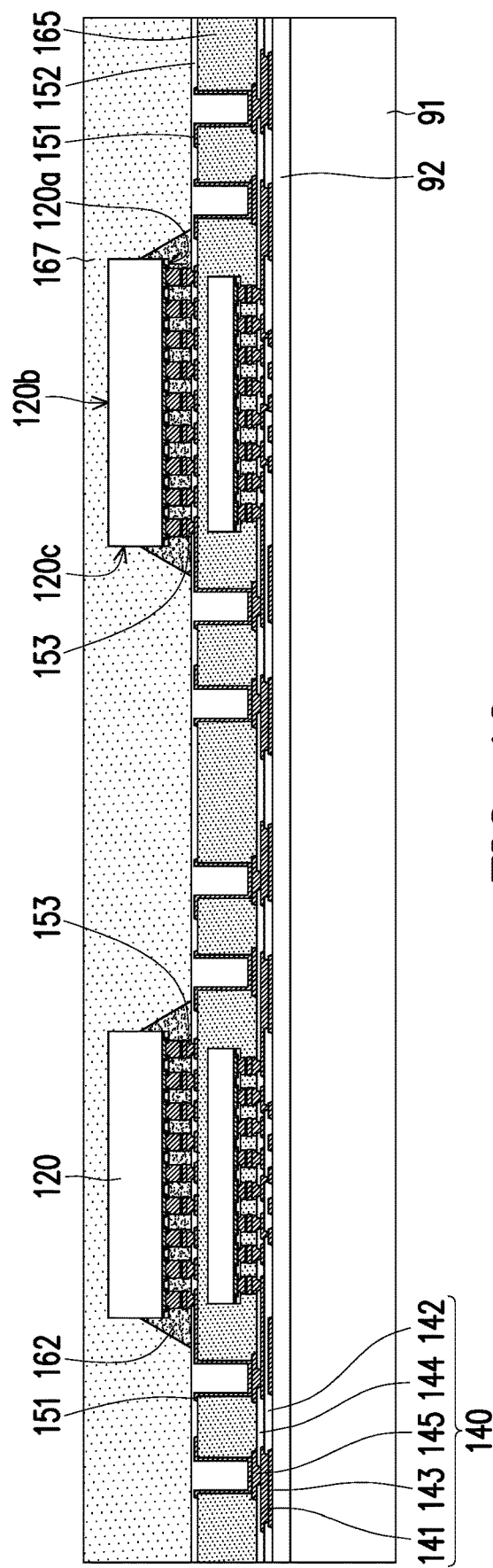
Figure 1H:
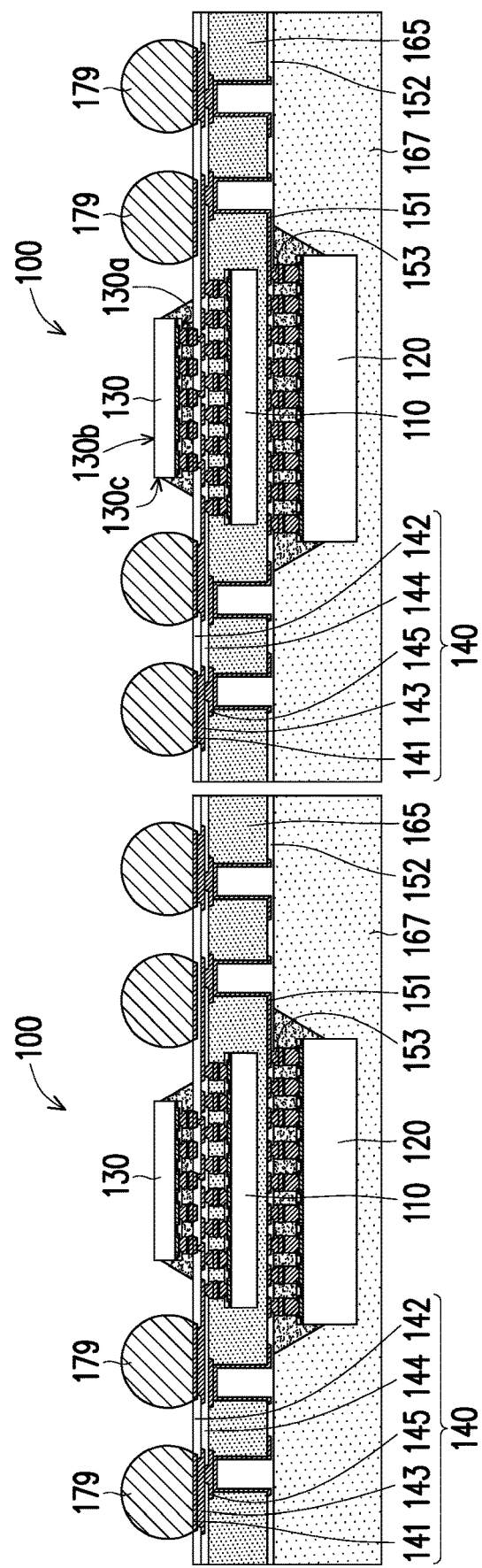
Figure 1I:
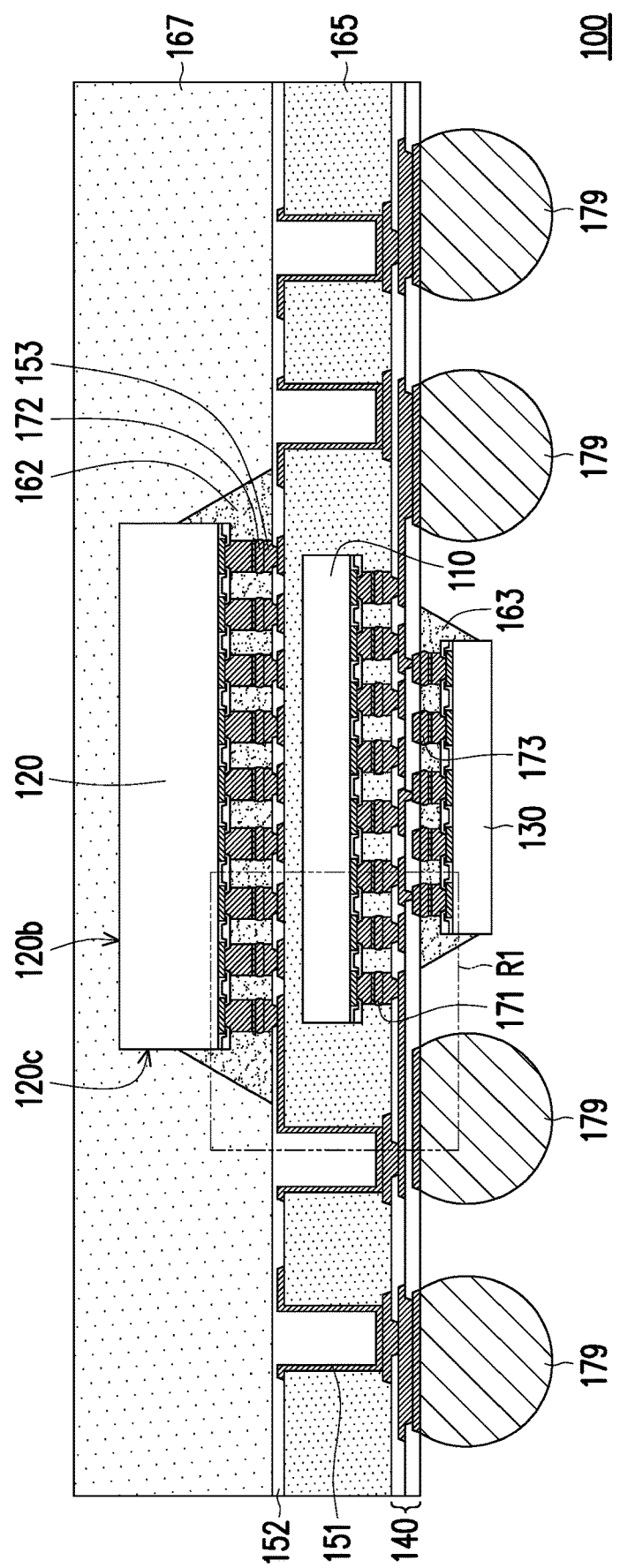
FIG. 1I is a schematic cross-sectional view of a package structure according to the first embodiment of the disclosure.
Figure 1J:
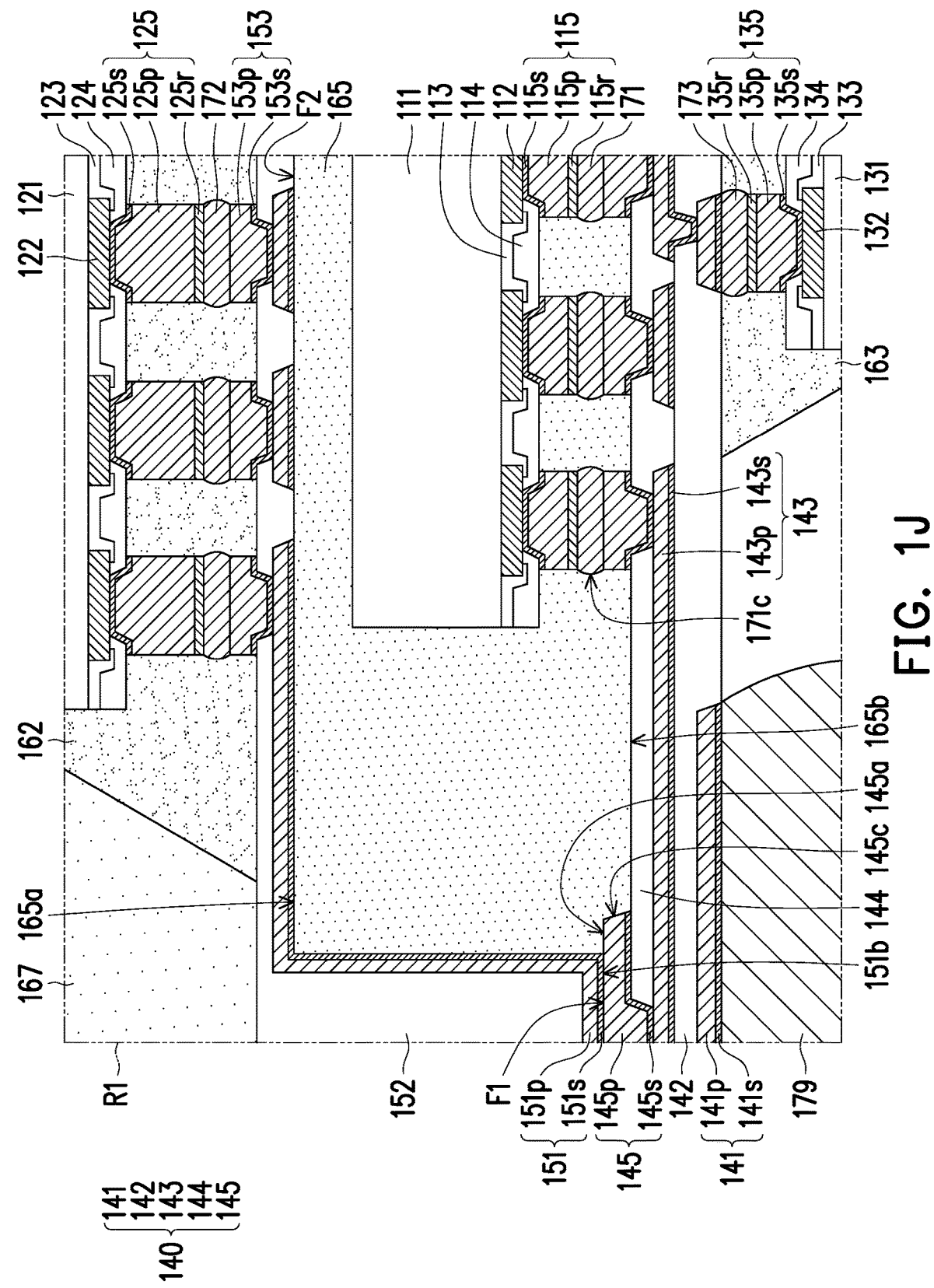
FIG. 1J is a schematic partial cross-sectional view of the package structure according to the first embodiment of the disclosure.

In the embodiment, the first die 110 may include a substrate 111 (labelled in FIG. 1J, and may be referred to as a first substrate), multiple die connection pads 112 (labelled in FIG. 1J, and may be referred to as first die connection pads), a die insulating layer 113 (labelled in FIG. 1J, and may be referred to as a first die insulating layer), a die protective layer 114 (labelled in FIG. 1J, and may be referred to as a first die protective layer), and multiple die terminals 115 (labelled in FIG. 1J, and may be referred to as first die terminals). A side of the substrate 111 has an element region (not shown), and a surface on which the element area is disposed may be referred to as a first active surface 110a. A surface opposite to the first active surface 110a may be referred to as a first back surface 110b. A surface connected between the first active surface 110a and the first back surface 110b may be referred to as a first side surface 110c. The die connection pads 112 may be disposed on the first active surface 110a. The die insulating layer 113 may cover the die connection pads 112, the die protective layer 114 may cover the die insulating layer 113, and the die insulating layer 113 and the die protective layer 114 may expose a portion of the die connection pad 112. In a general die design, elements in the element region (such as elements in the element region of the first die 110) may be electrically connected to a corresponding connection pad (such as the die connection pad 112 of the first die 110) by a corresponding back end of line interconnect (BEOL interconnect). The die terminal 115 may include a seed layer 115s (labelled in FIG. 1J), a plated layer 115p (labelled in FIG. 1J), and a conductive connection layer 115r (labelled in FIG. 1J), but the disclosure is not limited thereto. In an embodiment, the seed layer 115s of the die terminal 115 may be in direct contact with the die connection pad 112, and the plated layer 115p may be disposed between the seed layer 115s and the conductive connection layer 115r, but the disclosure is not limited thereto. The die connection pad 112 may be electrically connected to a corresponding conductive connection member 171 (may be referred to as a first conductive connection member) by the corresponding die terminal 115.

In the embodiment, the conductive connection member 171 may be a solder ball, a conductive bump, or a conductive connection member having other forms or shapes. The conductive connection member 171 may be formed via ball placement, reflow, and/or other suitable processes. The conductive connection member 171 may be disposed between the redistribution circuit layer 140 and the first die 110, so that the first die 110 is electrically connected to a corresponding circuit in the top conductive layer 145 by the corresponding conductive connection member 171. In an embodiment, the conductive connection member 171 may reduce damage to the first die 110 (such as elements on the first active surface 110a) and/or the redistribution circuit layer 140 (such as the top conductive layer 145 of the redistribution circuit layer 140) when the first die 110 is disposed on the redistribution circuit layer 140.

With reference to FIGS. 1B and 1C, a dielectric body 165 is formed on the carrier board 91. The dielectric body 165 may cover the first die 110. The dielectric body 165 may cover at least the first back surface 110b and the first side surface 110c of the first die 110. In the embodiment, the dielectric body 165 may further cover a portion of the first active surface 110a of the first die 110. In other words, a portion of the dielectric body 165 may be disposed between the first active surface 110a of the first die 110 and the redistribution circuit layer 140.

In the embodiment, the dielectric body 165 may be formed on the redistribution circuit layer 140. The dielectric body 165 may have a dielectric opening 165d exposing the top conductive layer 145. For example, a photoimageable dielectric material (PID material) may be coated on the redistribution circuit layer 140. Then, a portion of the photosensitive dielectric material may be cured by photopolymerization and/or baking. Moreover, the remaining photosensitive dielectric material that has not been cured is removed by wet cleaning or other suitable manners after the portion of the photosensitive dielectric material is cured. In this way, the dielectric body 165 having the dielectric opening 165d may be formed in the above-mentioned manner.

In an embodiment, a formation manner of the dielectric body 165 may be adjusted according to its properties, which is not limited by the disclosure.

In the embodiment, the dielectric body 165 may cover a conductive side surface 145c of the top conductive layer 145 and a portion of a conductive top surface 145a.

In the embodiment, the dielectric opening 165d of the dielectric body 165 may not expose the top insulating layer 144.

In the embodiment, the dielectric body 165 may further cover the conductive connection member 171. For example, the dielectric body 165 may further cover a sidewall 171c (labelled in FIG. 1J) of the conductive connection member 171.

With reference to FIGS. 1C and 1D, a first connection circuit 151 is formed on the carrier board 91. The first connection circuit 151 may cover the dielectric body 165. The first connection circuit 151 may fill in the dielectric opening 165d (labelled in FIG. 1C) of the dielectric body 165 to be electrically connected to a corresponding circuit in the redistribution circuit layer 140 (such as a corresponding circuit in the top conductive layer 145).

In the embodiment, the first connection circuit 151 may be formed by a sputtering process, a lithography process, an electroplating process, and/or an etching process, but the disclosure is not limited thereto. For example, a formation manner of the first connection circuit 151 may be the same or similar to the formation manner of the conductive layers 141, 143, and 145 in the redistribution circuit layer 140. That is, the first connection circuit 151 may include a seed layer 151s (labelled in FIG. 1J) and a plated layer 151p (labelled in FIG. 1J) having the same or similar pattern. The layout design of the first connection circuit 151 may be adjusted according to design requirements, which is not limited by the disclosure.

In the embodiment, the portion of the first connection circuit 151 disposed in the dielectric opening 165d may conformally cover a bottom and sidewalls of the dielectric opening 165d. The portion of the first connection circuit 151 disposed in the dielectric opening 165d may be in direct contact with the conductive top surface 145a of the top conductive layer 145. For example, the patterned seed layer 151s (labelled in FIG. 1J) belonging to the first connection circuit 151 may be in direct contact with the plated layer 145p (labelled in FIG. 1J) of the top conductive layer 145. In other words, a conductive bottom surface 151b of the first connection circuit 151 and a dielectric bottom surface 165b of the dielectric body 165 are non-coplanar. For example, a position (generally refers to a virtual surface extending therefrom) of the conductive bottom surface 151b of the first connection circuit 151 may be between a position (generally refers to a virtual surface extending therefrom) of a dielectric top surface 165a and a position (generally refers to a virtual surface extending from it) of the dielectric bottom surface 165b of the dielectric body 165.

In the embodiment, the first connection circuit 151 and the conductive layer 145 are formed by different steps. In this way, there may be an interface F1 (labelled in FIG. 1J) between the first connection circuit 151 and the top conductive layer 145 that are in contact with each other. For example, there may be the interface F1 between the patterned seed layer 151s (labelled in FIG. 1J) belonging to the first connection circuit 151 and the plated layer 145p of the top conductive layer 145.

With reference to FIGS. 1D and 1E, a patterned insulating layer 152 is formed on the carrier board 91. The material of the patterned insulating layer 152 may include inorganic materials, organic materials, other suitable insulating materials, or a stack of the above, which is not limited by the disclosure. In an embodiment, a formation manner of the patterned insulating layer 152 may be adjusted according to its properties, which is not limited by the disclosure.

In the embodiment, the patterned insulating layer 152 may cover the first connection circuit 151. The patterned insulating layer 152 may have multiple insulating openings 152d to expose a portion of the first connection circuit 151.

In the embodiment, the patterned insulating layer 152 may be in contact with the dielectric body 165. For example, the patterned insulating layer 152 may in direct contact with a portion of the dielectric top surface 165a (that is, a surface of the dielectric body 165 that is farthest from the carrier board 91 or the redistribution circuit layer 140) of the dielectric body 165.

In the embodiment, the patterned insulating layer 152 and the dielectric body 165 are formed by different steps. In this way, there may be an interface F2 (labelled in FIG. 1J) between the patterned insulating layer 152 and the dielectric body 165 that are in contact with each other. In an embodiment, the material of the patterned insulating layer 152 may be different from the material of the dielectric body 165.

In the embodiment, a portion of the patterned insulating layer 152 may fill in the dielectric opening 165d (labelled in FIG. 1C) of the dielectric body 165. In this way, a probability of the first connection circuit 151 disposed in the dielectric opening 165d peeling may be reduced. In addition, a thickness of the plating may be reduced, and manufacturing efficiency of a package structure 100 (labelled in FIG. 1H or FIG. 1I) may be improved when the first connection circuit 151 is formed.

With reference to FIGS. 1E and 1F, in the embodiment, a second connection circuit 153 may be formed on the patterned insulating layer 152. The second connection circuit 153 may be embedded or fill in the insulating opening 152d (labelled in FIG. 1E) of the patterned insulating layer 152 to be electrically connected to a corresponding circuit in the first connection circuit 151.

In the embodiment, a formation manner of the second connection circuit 153 may be the same or similar to the formation manner of the first connection circuit 151. For example, the second connection circuit 153 may include a seed layer 153s (labelled in FIG. 1J) and a plated layer 153p (labelled in FIG. 1J) having the same or similar pattern. A circuit layout of the second connection circuit 153 may be adjusted according to design requirements, which is not limited by the disclosure.

In the embodiment, a portion of the second connection circuit 153 disposed in the insulating opening 152d (labelled in FIG. 1E) may be in direct contact with the first connection circuit 151. For example, the patterned seed layer 153s (labelled in FIG. 1J) belonging to the second connection circuit 153 may be in direct contact with the plated layer 151p (labelled in FIG. 1J) of the first connection circuit 151.

With reference to FIGS. 1F and 1G a second die 120 may be disposed on the dielectric body 165 after the first connection circuit 151 is formed. The second die 120 may be electrically connected to the first die 110 by a corresponding circuit in the first connection circuit 151.

In the embodiment, the second die 120 may include a substrate 121 (labelled in FIG. 1J, and may be referred to as a second substrate), multiple die connection pads 122 (labelled in FIG. 1J, and may be referred to as second die connection pads), a die insulating layer 123 (labelled in FIG. 1J, and may be referred to as a second die insulating layer), a die protective layer 124 (labelled in FIG. 1J, and may be referred to as a second die protective layer) and multiple die terminals 125 (labelled in FIG. 1J, and may be referred to as second die terminals). A side of the substrate 121 has an element region (not shown), and a surface on which the element region is disposed may be referred to as a second active surface 120a. A surface opposite to the second active surface 120a may be referred to as a second back surface 120b. A surface connected between the second active surface 120a and the second back surface 120b may be referred to as a second side surface 120c. The die connection pads 122 may be located on the second active surface 120a. The die insulating layer 123 may cover the die connection pads 122, the die protective layer 124 may cover the die insulating layer 123, and the die insulating layer 123 and the die protective layer 124 may expose a portion of the die connection pad 122. Elements in the element region of the second die 120 may be electrically connected to the corresponding die connection pad 122 by a corresponding BEOL interconnect. The die terminal 125 may include a seed layer 125s (labelled in FIG. 1J), a plated layer 125p (labelled in FIG. 1J), and a conductive connection layer 125r (labelled in FIG. 1J), but the disclosure is not limited thereto. In an embodiment, the seed layer 125s of the die terminal 125 may be in direct contact with the die connection pad 122, and the plated layer 125p may be disposed between the seed layer 125s and the conductive connection layer 125r, but the disclosure is not limited thereto. The die connection pad 122 may be electrically connected to a corresponding conductive connection member 172 (may be referred to as a second conductive connection member) by the corresponding die terminal 125.

In the embodiment, the conductive connection member 172 may be the same or similar to the conductive connection member 171 in form, shape, or formation manner. The conductive connection member 172 may be disposed between the second connection circuit 153 and the second die 120, so that the second die 120 is electrically connected to a corresponding circuit in the first connection circuit 151 by the corresponding conductive connection member 172. In an embodiment, the second die 120 is disposed on a corresponding circuit (such as the second connection circuit 153, but is not limited thereto), the conductive connection member may reduce damage to the second die 120 (such as elements on the second active surface 120a) and/or the connected corresponding circuit (such as the second connection circuit 153, but is not limited thereto).

In the embodiment, a filling layer 162 may be formed between the second die 120 and the patterned insulating layer 152. The filling layer 162 may include Capillary Underfill (CUF) or other suitable underfill, but the disclosure is not limited thereto.

With reference to FIG. 1G again, in the embodiment, a mold sealed body 167 may be formed on the patterned insulating layer 152. The mold sealed body 167 covers the second die 120. For example, the mold sealed body 167 may cover the second side 120c of the second die 120. In an embodiment, the material of the mold sealed body 167 may include epoxy resin or other suitable molding compounds, but the disclosure is not limited thereto. The mold sealed body 167 is formed by, for example, a molding process, but the disclosure is not limited thereto.

In the embodiment, the mold sealed body 167 may further cover the second back surface 120b of the second die 120, but the disclosure is not limited thereto.

In an embodiment not shown, the mold sealed body 167 may further cover the first active surface 120a of the second die 120.

In an embodiment, a Young's modulus of the mold sealed body 167 may be greater than a Young's modulus of the dielectric body 165. The mold sealed body 167 may serve as a structural support as compared to the dielectric body 165.

With reference to FIGS. 1G and 1H, in the embodiment, a third die 130 (labelled in FIG. 1H) may be disposed on the redistribution circuit layer 140 that is opposite to the first die 110 after the carrier board 91 (labeled in FIG. 1G) is removed. That is, the redistribution circuit layer 140 is disposed between the first die 110 and the third die 130. The third die 130 is electrically connected to a corresponding circuit in the redistribution circuit layer 140.

In the embodiment, the third die 130 may include a substrate 131 (labelled in FIG. 1J, and may be referred to as a third substrate), multiple die connection pads 132 (labelled in FIG. 1J, and may be referred to as third die connection pads), a die insulating layer 133 (labelled in FIG. 1J, and may be referred to as a third die insulating layer), a die protective layer 134 (labelled in FIG. 1J, and may be referred to as a third die protective layer), and multiple die terminals 135 (labelled in FIG. 1J, and may be referred to as third die terminals). A side of the substrate 131 has an element region (not shown), and a surface on which the element region is disposed may be referred to as a third active surface 130a. A surface opposite to the third active surface 130a may be referred to as a third back surface 130b. A surface connected between the third active surface 130a and the third back surface 130b may be referred to as a third side surface 130c. The die connection pads 132 may be disposed on the third active surface 130a. The die insulating layer 133 may cover the die connection pads 132, the die protective layer 134 may cover the die insulating layer 133, and the die insulating layer 133 and the die protective layer 134 may expose a portion of the die connection pad 132. Elements in the element region of the third die 130 may be electrically connected to the corresponding die connection pad 132 by a corresponding BEOL interconnect. The die terminal 135 may include a seed layer 135s (labelled in FIG. 1J), a plated layer 135p (labelled in FIG. 1J), and a conductive connection layer 135r (labelled in FIG. 1J), but the disclosure is not limited thereto. In an embodiment, the seed layer 135s of the die terminal 135 may be in direct contact with the die connection pad 132, and the plated layer 135p may be disposed between the seed layer 135s and the conductive connection layer 135r, but the disclosure is not limited thereto. The die connection pad 132 may be electrically connected to a corresponding conductive connection member 173 (may be referred to as a third conductive connection member) by the corresponding die terminal 135.

In the embodiment, the conductive connection member 173 may be the same or similar to the conductive connection member 171 in form, shape, or formation manner. The conductive connection member 173 is disposed between the redistribution circuit layer 140 and the third die 130, so that the third die 130 is electrically connected to a corresponding circuit in the redistribution circuit layer 140 by the corresponding conductive connection member 173. In an embodiment, the conductive connection member 173 may reduce damage to the third die 130 (such as elements on the third active surface 130a) and/or the redistribution circuit layer 140 when the third die 130 is disposed on the redistribution circuit layer 140.

In the embodiment, the third active surface 130a of the third die 130 may face the first active surface 110a of the first die 110. In this way, a signal transmission distance between the third die 130 and the first die 110 may be reduced.

In the embodiment, a filling layer 163 may be formed between the third die 130 and the redistribution circuit layer 140. The filling layer 163 may include Capillary Underfill or other suitable underfill, but the disclosure is not limited thereto.

With reference to FIGS. 1G and 1H, in the embodiment, multiple conductive terminals 179 may be formed on the redistribution circuit layer 140 that is opposite to the first die 110 after the carrier board 91 is removed. The conductive terminal 179 may be a conductive pillar, a solder ball, a conductive bump, or a conductive terminal having other forms or shapes. The conductive terminal 179 may be formed via electroplating, deposition, ball placement, reflow, and/or other suitable processes. The conductive terminal 179 may be electrically connected to a corresponding circuit in the first connection circuit 151 by a corresponding circuit in the redistribution circuit layer 140.

With reference to FIG. 1H, in the embodiment, a singulation process may be used to cut through at least the redistribution circuit layer 140, the dielectric body 165, and the patterned insulating layer 152. The singulation process may include, for example, a dicing process/cutting process, but the disclosure is not limited thereto.

It should be noted that after the singulation process is performed, the singulated elements continue to use similar reference numerals. For example, the first die 110 (as shown in FIG. 1G) after singulation may be the first die 110 (as shown in FIG. 1H), the second die 120 (as shown in FIG. 1G) after singulation may be the second die 120 (shown in FIG. 1H), the redistribution circuit layer 140 (shown in FIG. 1G) after singulation may be the redistribution circuit layer 140 (shown in FIG. 1H), the dielectric body 165 (shown in FIG. 1G) after singulation may be the dielectric body 165 (as shown in FIG. 1H), and the patterned insulating layer 152 (as shown in FIG. 1G) after singulation may be the patterned insulating layer 152 (as shown in FIG. 1H), and so on. Other singularized elements follow the same reference numerals rules described above, and are not repeated or specially illustrated here.

It should be noted that the disclosure does not limit the sequence of disposing the third die 130, forming the multiple conductive terminals 179, and the singulation process (if any). For example, the carrier board 91 may be removed first, then the third die 130 may be disposed, and then the multiple conductive terminals 179 may be formed, after which the singulation process may be performed. For example, the singulation process may be performed first, then the carrier board 91 is removed, and then the third die 130 is disposed, after which the multiple conductive terminals 179 are formed. For example, the carrier board 91 may be removed first, then the third die 130 may be disposed, and then the singulation process may be performed, after which the multiple conductive terminals 179 may be formed.

FIG. 1I is a schematic cross-sectional view of a package structure according to the first embodiment of the disclosure. FIG. 1J is a schematic partial cross-sectional view of the package structure according to the first embodiment of the disclosure. FIG. 1J may be an enlarged view corresponding to a region R1 in FIG. 1I. With reference to FIGS. 1I and 1J, production of the package structure 100 of the embodiment may be roughly completed after the above steps.

The package structure 100 includes the first die 110, the second die 120, the third die 130, the redistribution circuit layer 140, the first connection circuit 151, the patterned insulating layer 152, and the dielectric body 165. The first die 110 is disposed on the redistribution circuit layer 140. The first die 110 is electrically connected to the corresponding circuit in the redistribution circuit layer 140. The dielectric body 165 is disposed on the redistribution circuit layer 140 and covers the first die 110. The first connection circuit 151 is disposed on the dielectric body 165. The first connection circuit 151 is electrically connected to the corresponding circuit in the redistribution circuit layer 140. The patterned insulating layer 152 covers the first connection circuit 151. The portion of the patterned insulating layer 152 is embedded in the dielectric body 165. The second die 120 is disposed on the dielectric body 165 and is electrically connected to the corresponding circuit in the first connection circuit 151. The third die 130 is disposed on the redistribution circuit layer 140 and is opposite to the first die 110. The third die 130 is electrically connected to the corresponding circuit in the redistribution circuit layer 140.

In an embodiment, the first die 110, the second die 120, and the third die 130 may be dies, packaged chips, stacked chip packages, or application-specific integrated circuit (ASIC) having the same or different functions, but the disclosure is not limited thereto.

In an embodiment, the first die 110, the second die 120, and the third die 130 may be heterogeneous dies. For example, one of the first die 110 and the third die 130 may be a dynamic random access memory (DRAM) die, a static random access memory (SRAM) die or a high-bandwidth memory (HBM) die, while another of the first die 110 and the second die 120 may be an application-specific integrated circuit (ASIC) die, an application processor (AP), a system on chip (SoC) die, or other similar high-performance computing (HPC) die, but the disclosure is not limited thereto. In another example, the second die 120 may be a power management integrated circuit (PMIC) die, but the disclosure is not limited thereto.

In the embodiment, the first die 110, the second die 120, and the third die 130 may overlap each other, but the disclosure is not limited thereto.

In the embodiment, a size of the second die 120 may be larger than a size of the first die 110, and the size of the first die 110 may be larger than a size of the third die 130, but the disclosure is not limited thereto.

In the embodiment, a thickness of the second die 120 may be greater than a thickness of the first die 110, and the thickness of the first die 110 may be greater than a thickness of the third die 130, but the disclosure is not limited thereto.

In the embodiment, the package structure 100 may further include the mold sealed body 167. The mold sealed body 167 may cover the second die 120.

In the embodiment, the mold sealed body 167 may cover the second back surface 120*b* and the second side surface 120*c* of the second die 120, but the disclosure is not limited thereto.

In the embodiment, the package structure 100 may further include the conductive connection member 171. The conductive connection member 171 may be disposed between the redistribution circuit layer 140 and the first die 110, so that the first die 110 is electrically connected to the corresponding circuit in the redistribution circuit layer 140 by the corresponding conductive connection member 171.

In the embodiment, the package structure 100 may further include the second connection circuit 153. The second connection circuit may be disposed on the patterned insulating layer 152 and embedded in the patterned insulating layer 152.

In the embodiment, the package structure 100 may further include the conductive connection member 172. The conductive connection member 172 may be disposed between the second connection circuit 153 and the second die 120, so that the second die 120 is electrically connected to the corresponding circuit in the first connection circuit 151 by the corresponding conductive connection member 172 and a corresponding circuit in the second connection circuit 153.

In the embodiment, the package structure 100 may further include the conductive connection member 173. The conductive connection member 173 is disposed between the redistribution circuit layer 140 and the third die 130, so that the third die 130 is electrically connected to the corresponding circuit in the redistribution circuit layer 140 by the corresponding conductive connection member 173.

In the embodiment, the package structure 100 may further include the conductive connection member 171 corresponding to the first die 110, the conductive connection member 172 corresponding to the second die 120, and the conductive connection member 173 corresponding to the third die 130. In a package structure (such as the package structure 100) having multiple dies (such as the first die 110, the second die 120, and the third die 130), the corresponding conductive connection members (such as the conductive connection member 171, the conductive connection member 172, and the conductive connection member 173) may reduce damage to the dies and/or the corresponding conductive members when the dies are being disposed. In this way, the quality and yield of the package structure having multiple dies can be improved.

Figure 2:
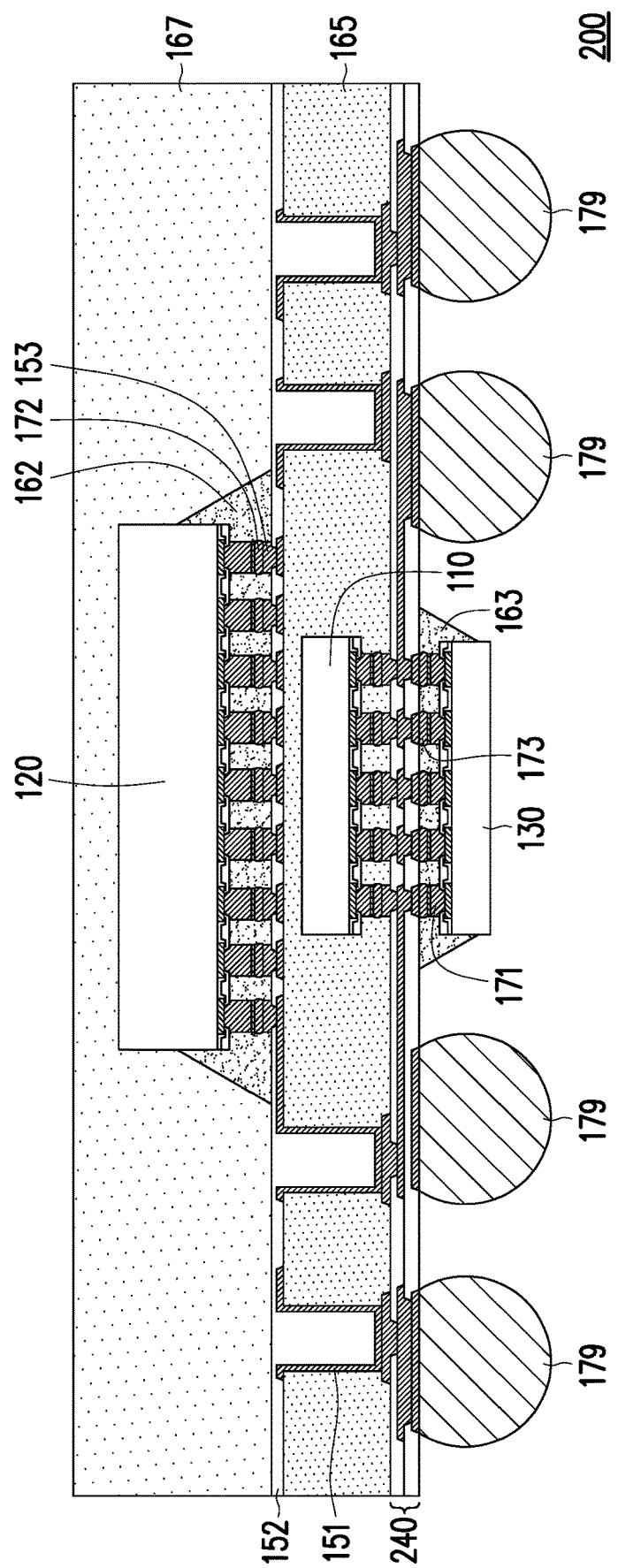
FIG. 2 is a schematic cross-sectional view of a package structure according to a second embodiment of the disclosure.

FIG. 2 is a schematic cross-sectional view of a package structure according to a second embodiment of the disclosure. A package structure 200 of the second embodiment is similar to the package structure 100 of the first embodiment, and similar components are labelled by the same reference numerals, and have similar functions, materials, or formation manners, and descriptions are omitted.

With reference to FIG. 2, the package structure 200 includes the first die 110, the second die 120, the third die 130, a redistribution circuit layer 240, the first connection circuit 151, the patterned insulating layer 152, and the dielectric body 165. The first die 110 is disposed on the redistribution circuit layer 240. The first die 110 is electrically connected to a corresponding circuit in the redistribution circuit layer 240. The dielectric body 165 is disposed on the redistribution circuit layer 240. The first connection circuit 151 is electrically connected to a corresponding circuit in the redistribution circuit layer 240. The third die 130 is disposed on the redistribution circuit layer 240 and is opposite to the first die 110. The third die 130 is electrically connected to a corresponding circuit in the redistribution circuit layer 240.

In the embodiment, a formation manner of the redistribution circuit layer 240 may be the same or similar to the formation manner of the redistribution circuit layer 140 in the foregoing embodiment, which is not repeated here.

In the embodiment, the signal transmission distance between the first die 110 and the third die 130 is substantially the same as a physical distance between the first die 110 and the third die 130. For example, a signal between the first die 110 and the third die 130 may be transmitted by corresponding conductive members (such as the corresponding conductive connection member 171, a corresponding conductive layer and the corresponding conductive connection member 171 in the redistribution circuit layer 240), and a distance between the die terminal 115 of the first die 110 and the die terminal 135 of the third die 130 is substantially equal to a height or a thickness (such as a height of the corresponding conductive connection member 171, a sum of heights of the corresponding conductive layer and the corresponding conductive connection member 171 in the redistribution circuit layer 240) of the foregoing conductive member. In this way, the quality and efficiency of signal transmission between the first die 110 and the third die 130 may be improved.

Figure 3:
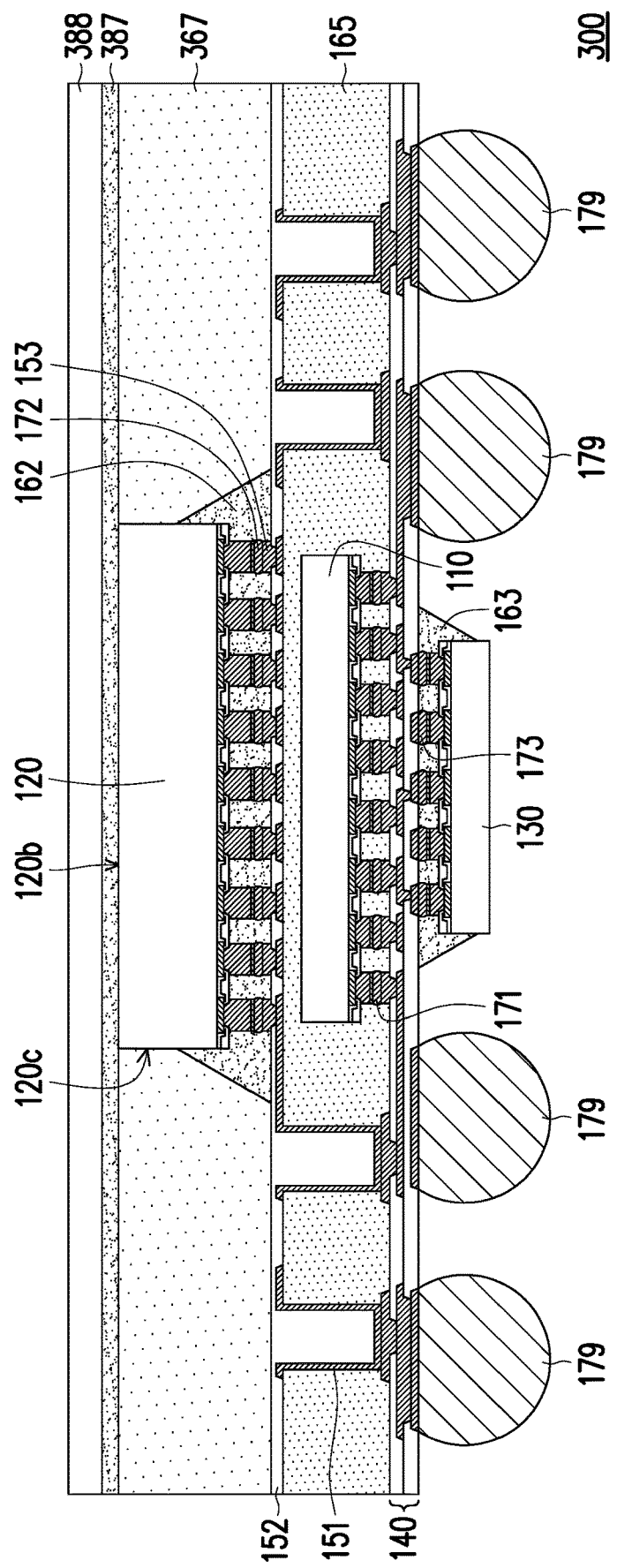
FIG. 3 is a schematic cross-sectional view of a package structure according to a third embodiment of the disclosure.

FIG. 3 is a schematic cross-sectional view of a package structure according to a third embodiment of the disclosure. A package structure 300 of the third embodiment is similar to the package structure 100 of the first embodiment, and similar components are labelled by the same reference numerals, and have similar functions, materials, or formation manners, and descriptions are omitted.

With reference to FIG. 3, the package structure 300 includes the first die 110, the second die 120, the third die 130, the redistribution circuit layer 140, the first connection circuit 151, the patterned insulating layer 152, the dielectric body 165, and a mold sealed body 367. The mold sealed body 367 may cover the second die 120.

In the embodiment, a formation manner of the mold sealed body 367 may be the same or similar to the formation manner of the mold sealed body 167 in the foregoing embodiment, which is not repeated here.

In the embodiment, the mold sealed body 367 may cover the second side surface 120c of the second die 120, and the mold sealed body 367 may expose the second back surface 120b of the second die 120.

In the embodiment, the package structure 300 may further include a heat dissipation member 388. The heat dissipation member 388 may be thermally coupled to the second die 120.

In the embodiment, there may be a thermal interface material (TIM) 387 between the second back surface 120b of the second die 120 and the heat dissipation member 388, but the disclosure is not limited thereto.

In an embodiment, the second back surface 120b of the second die 120 may be in direct contact with the heat dissipation member 388, but the disclosure is not limited thereto.

In an embodiment, a heat dissipation member similar to the heat dissipation member 388 may have fins, but the disclosure is not limited thereto.

In summary, the die package structure and the manufacturing method of the die package structure of the disclosure integrate multiple dies and have good quality and yield.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A package structure, comprising:
   a redistribution circuit layer;
   a first die, disposed on the redistribution circuit layer and electrically connected to the redistribution circuit layer;
   a dielectric body, disposed on the redistribution circuit layer and covering the first die;
   a first connection circuit, disposed on the dielectric body and electrically connected to the redistribution circuit layer;
   a patterned insulating layer, covering the first connection circuit, and a portion of the patterned insulating layer is embedded in the dielectric body;
   a second die, disposed on the dielectric body and electrically connected to the first connection circuit; and
   a third die, disposed on the redistribution circuit layer and is opposite to the first die, and the third die is electrically connected to the redistribution circuit layer,
   wherein the redistribution circuit layer comprises:
   a top insulating layer; and
   a top conductive layer, disposed on the top insulating layer and embedded in the top insulating layer, and the dielectric body covers a portion of a conductive top surface and a conductive side surface of the top conductive layer.

2. The package structure according to claim 1, wherein the dielectric body has a dielectric bottom surface, the first connection circuit has a conductive bottom surface, and the dielectric bottom surface and the conductive bottom surface are non-coplanar.

3. The package structure according to claim 1, wherein the patterned insulating layer is in contact with the dielectric body, and there is an interface between the patterned insulating layer and the dielectric body.

4. The package structure according to claim 1, wherein a third active surface of the third die faces a first active surface of the first die, and the dielectric body covers a first back surface, a first side surface and a portion of the first active surface of the first die.

5. The package structure according to claim 1, wherein the first connection circuit is in direct contact with the conductive top surface of the top conductive layer, and there is an interface between the first connection circuit and the top conductive layer.

6. The package structure according to claim 1, wherein a thickness of the second die is greater than a thickness of the first die, and the thickness of the first die is greater than a thickness of the third die.

7. The package structure according to claim 1, further comprising:
a mold sealed body, covering the second die.

8. The package structure according to claim 1, further comprising:
a second connection circuit, disposed on the patterned insulating layer and embedded in the patterned insulating layer; and
a second conductive connection member, disposed between the second connection circuit and the second die, and the second die is electrically connected to the second connection circuit by the second conductive connection member.

9. The package structure according to claim 1, further comprising:
a third conductive connection member, disposed between the redistribution circuit layer and the third die, and the third die is electrically connected to the redistribution circuit layer by the third conductive connection member.

10. A package structure, comprising:
a redistribution circuit layer;
a first die, disposed on the redistribution circuit layer and electrically connected to the redistribution circuit layer;
a dielectric body, disposed on the redistribution circuit layer and covering the first die;
a first connection circuit, disposed on the dielectric body and electrically connected to the redistribution circuit layer;
a patterned insulating layer, covering the first connection circuit, and a portion of the patterned insulating layer is embedded in the dielectric body;
a second die, disposed on the dielectric body and electrically connected to the first connection circuit; and
a third die, disposed on the redistribution circuit layer and is opposite to the first die, and the third die is electrically connected to the redistribution circuit layer, wherein the redistribution circuit layer comprises a top insulating layer, and a top conductive layer disposed on the top insulating layer and embedded in the top insulating layer, the package structure further comprising:
a first conductive connection member, disposed between the redistribution circuit layer and the first die, and the first die is electrically connected to the top conductive layer by the first conductive connection member.

11. The package structure according to claim 10, wherein the dielectric body further covers the first conductive connection member.

12. The package structure according to claim 10, wherein the dielectric body has a dielectric bottom surface, the first connection circuit has a conductive bottom surface, and the dielectric bottom surface and the conductive bottom surface are non-coplanar.

13. The package structure according to claim 10, wherein the patterned insulating layer is in contact with the dielectric body, and there is an interface between the patterned insulating layer and the dielectric body.

14. The package structure according to claim 10, wherein a third active surface of the third die faces a first active surface of the first die, and the dielectric body covers a first back surface, a first side surface and a portion of the first active surface of the first die.

15. A manufacturing method of a package structure, comprising:
forming a redistribution circuit layer on a carrier board;
disposing a first die on the redistribution circuit layer to electrically connect to the redistribution circuit layer;
forming a dielectric body on the carrier board to cover the first die;
forming a first connection circuit on the carrier board, and a portion of the first connection circuit penetrates the dielectric body to electrically connect to the redistribution circuit layer;
forming a patterned insulating layer on the carrier board to cover the first connection circuit and embed into the dielectric body;
disposing a second die on the dielectric body to electrically connect to the first connection circuit; and
removing the carrier board, so as to dispose a third die on the redistribution circuit layer, the third die is opposite to the first die, and the third die is electrically connected to the redistribution circuit layer, wherein the redistribution circuit layer comprises:
a top insulating layer; and
a top conductive layer, disposed on the top insulating layer and embedded in the top insulating layer, and the dielectric body covers a portion of a conductive top surface and a conductive side surface of the top conductive layer.

16. The manufacturing method of the package structure according to claim 15, further comprising:
forming a mold sealed body on the dielectric body to cover the second die, and removing the carrier board after the mold sealed body is formed.

17. The manufacturing method of the package structure according to claim 15, wherein
the dielectric body comprises a dielectric opening that exposes a portion of the top conductive layer; and
a portion of the first connection circuit conformally covers the dielectric opening.

18. The manufacturing method of the package structure according to claim 17, wherein the dielectric opening does not expose the top insulating layer.

19. The manufacturing method of the package structure according to claim 15, further comprising:
performing a cutting process, so as to cut the redistribution circuit layer, the dielectric body, and the patterned insulating layer.

* * * * *